United States Patent
Chang

(10) Patent No.: US 7,157,976 B2
(45) Date of Patent: Jan. 2, 2007

(54) HIGH FREQUENCY AMPLIFIER

(75) Inventor: Chien-Fu Chang, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 78 days.

(21) Appl. No.: 10/983,411

(22) Filed: Nov. 8, 2004

(65) Prior Publication Data
US 2006/0022750 A1   Feb. 2, 2006

(30) Foreign Application Priority Data
Jul. 28, 2004   (TW) ............... 93122530 A

(51) Int. Cl.
*H03F 3/08*   (2006.01)
(52) U.S. Cl. .................. 330/308; 330/84; 330/85
(58) Field of Classification Search ............ 330/84–85, 330/308, 124 R
See application file for complete search history.

(56) References Cited

U.S. PATENT DOCUMENTS

| | | | |
|---|---|---|---|
| 6,114,913 A | 9/2000 | Entrikin | 330/308 |
| 6,304,357 B1 | 10/2001 | Ohhata et al. | 398/209 |
| 6,323,734 B1 * | 11/2001 | Henrion et al. | 330/308 |
| 6,658,217 B1 | 12/2003 | Ohhata et al. | 398/202 |
| 2006/0001493 A1 * | 1/2006 | Harms et al. | 330/308 |

* cited by examiner

*Primary Examiner*—Benny T. Lee
*Assistant Examiner*—Hieu Nguyen
(74) *Attorney, Agent, or Firm*—Welsh & Katz,Ltd.

(57) ABSTRACT

A high frequency amplifier comprising a first trans-impedance amplifier, a second trans-impedance amplifier, a third amplifier, and a variant current source is provided. The first trans-impedance amplifier receives an input current and outputs a first output voltage accordingly. The second trans-impedance outputs a second voltage. The third amplifier receives the first and the second voltage. The variant current source is connected between the input terminal of the second trans-impedance and a ground terminal or a power supply source. The variant current source delivers a variant current to change the second voltage such that the second voltage may follow the first voltage. The input current flows into the first trans-impedance amplifier, while the variant current flows into the second trans-impedance amplifier. The input current flows out the first trans-impedance amplifier, while the variant current flows out the second trans-impedance amplifier.

15 Claims, 5 Drawing Sheets

HIGH FREQUENCY AMPLIFIER

This Non-provisional application claims priority under 35 U.S.C. § 119(a) on Patent Application No(s). 093122530 filed in Taiwan, R.O.C. on Jul. 28, 2004, the entire contents of which are hereby incorporated by reference.

BACKGROUND OF THE INVENTION

1. Field of Invention

The invention relates to an amplifier and, in particular, to a high frequency amplifier with trans-impedance amplifiers and a DC Feed-Forward circuit structure used in a high-speed optical communication interface.

2. Related Art

The trans-impedance amplifier (TIA) is a device with a single terminal output. When the single terminal output goes through an amplifier and changes to differential terminal outputs, an additional DC voltage is required. The DC voltage and the output DC voltage of the TIA will affect the performance of the amplifier. Both of the DC voltages have to be appropriately controlled in order to maintain the amplifier's normal performance.

The TIA in the prior art shown in FIG. 1 consists of a first amplifier 11, a feedback resistor 12, a low-pass filter 13, and a second amplifier 14. The voltage output from the first amplifier 11 enters the first terminal A of the second amplifier 14. The low-pass filter 13 extracts the DC voltage of the first terminal A and sends it to the next gain stage. Although the circuit structure in FIG. 1 can provide a balanced DC voltage to the next differential gain stage, the second terminal B is affected by the low-pass filter 40. Both the first terminal A and the second terminal B have different reactions to the power supply source, which in turn affects the response of the TIA to PSRR.

Another structure of the TIA in the prior art is illustrated in FIG. 2. It consists of a first amplifier 21, a second amplifier 22, a third amplifier 23, a first feedback resistor 24, a second feedback resistor 25, and a variant current source 26. This structure fixes the reference voltage on the second terminal B of the third amplifier 23. The DC voltage on the first terminals A changes with the input current Iin. Therefore, changing the strength of the variant current source 26 modifies the DC voltage on the first terminal A, making the DC voltages of the terminals A and B consistent.

Some technical problems existing in the structure of FIG. 2 have to be solved. For example, increasing the transmission speed makes the first and second feedback resistors 24, 25 decrease continually. The DC voltage variation on the first terminal A also decreases. If differences in the manufacturing processes are also taken into account during the design, the second terminal B has to cover the offset state. This will make it difficult to set the DC voltage. The incorrect reference voltage will make the variant current source 26 dormant or active with a very little signal. The former situation results in the fact that the first terminal A cannot follow the voltage on the second terminal B, whereas the latter situation affects the sensitivity of the TIA. The worst case will render the TIA totally ineffective.

When using the amplifiers shown in FIGS. 1 and 2 in a high-frequency circuit or a high-frequency optical communication interface, one also faces the problem of noises that is hard to overcome.

SUMMARY OF THE INVENTION

In view of the foregoing, an objective of the invention is to provide a high-frequency trans-impedance amplifier (TIA).

To achieve the above objective, the disclosed high-frequency amplifier includes a first trans-impedance amplifier receiving an input current and output a first voltage; a second trans-impedance amplifier outputting a second voltage; a third amplifier receiving the first and second voltages; and a variant current source coupled between the input terminal of the second trans-impedance amplifier and a ground terminal or a power supply source to output a variant current for changing the second voltage so that the second voltage follows the first voltage. When the input current enters the first trans-impedance amplifier, the variant current flows into the second trans-impedance amplifier. When the input current leaves the first trans-impedance amplifier, the variant current flows out of the second trans-impedance amplifier.

Another embodiment of the invention includes a first trans-impedance amplifier receiving an input current and output a first voltage; a second trans-impedance amplifier outputting a second voltage; a third amplifier receiving the first and second voltages; a variant current source coupled between the input terminal of the second trans-impedance amplifier and a ground terminal to output a variant current for changing the second voltage so that the second voltage follows the first voltage; a fourth amplifier whose input terminal receives the first and second voltages and whose output terminal is coupled to the variant current source; and a fixed current source coupled to the input terminal of the first trans-impedance amplifier. The output current of the variant current source flows out of the second trans-impedance amplifier. The current output from the fixed current source flows out of the first trans-impedance amplifier.

According to the principle of the invention, the voltage changes on the two input terminals of the third amplifier do not have any influence on the first terminal. Even with an offset so that the two terminals cannot match completely, the performance of the primary part of the trans-impedance amplifier is not affected at all.

According to the invention, the output voltage of the trans-impedance amplifier can be adjusted by changing the variant current source. This can trace the change of the DC voltage output by the first trans-impedance amplifier.

The invention has the advantage of providing a balanced DC voltage to the next stage circuit.

The invention has the advantage of avoiding problems caused by imbalanced DC currents. Moreover, there is no effect on the efficiency of voltage to current conversion at the first level.

The invention can increase the PSRR of the trans-impedance amplifier.

It is to be understood that both the foregoing general description and the following detailed description are exemplary and are intended to provide explanation of the invention as claimed.

BRIEF DESCRIPTION OF THE DRAWINGS

The accompanying drawings, which are included to provide a further understanding of the invention and constitute a part of this specification, illustrate embodiments of the invention and together with the description serve to explain the principles of the invention. In the drawings.

DETAILED DESCRIPTION OF THE INVENTION

Reference will now be made in detail to the preferred embodiments of the invention, examples of which are illustrated in the accompanying drawings.

Figure 1:
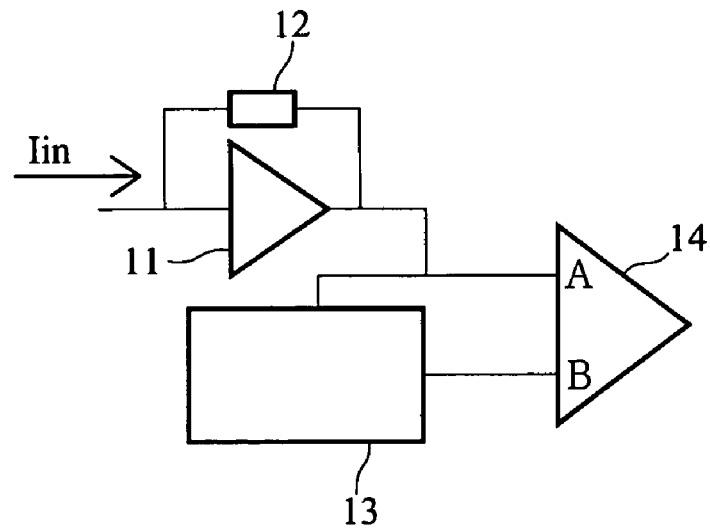
FIG. 1 is the circuit diagram of a TIA in the prior art.
Figure 2:
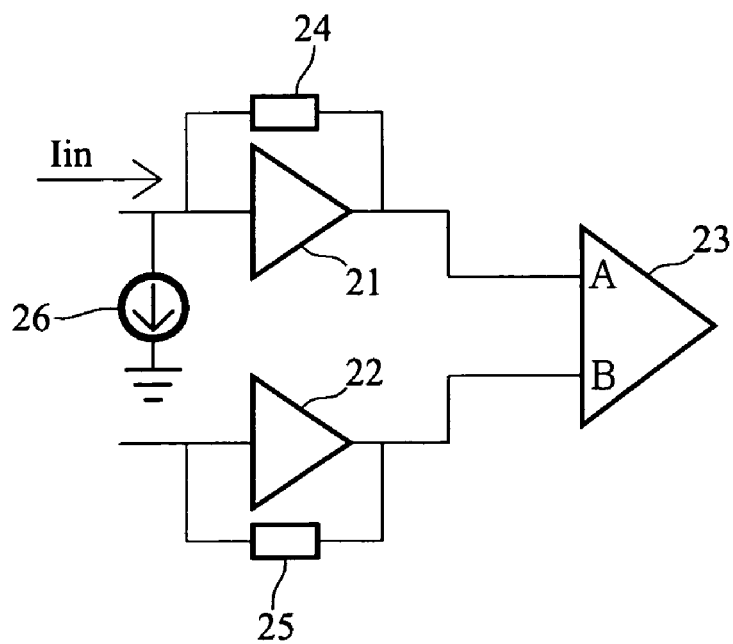
FIG. 2 is the circuit diagram of another TIA in the prior art.
Figure 3:
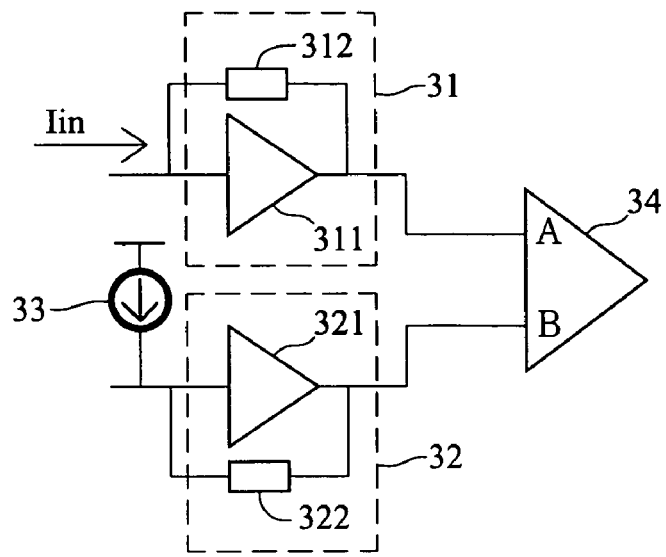
FIG. 3 is a circuit diagram according to the first embodiment of the disclosed high-frequency TIA.

FIG. 3 shows a circuit of the disclosed high-frequency amplifier. It is comprised of a first trans-impedance amplifier (TIA) 31, a second TIA 32, a variant current source 33, and a third amplifier 34. The first TIA output a first voltage, and the second TIA 32 outputs a second voltage. The first voltage output from the TIA 31 and the second voltage output from the second TIA 32 enter the third amplifier 34. The third amplifier 34 is a differential amplifier.

The first TIA 31 contains a first amplifier 311 and a first feedback resistor 312. The first feedback resistor 312 is coupled between the input and output terminals of the first amplifier 311. The first amplifier 311 is an operational amplifier.

The second TIA 32 contains a second amplifier 321 and a second feedback resistor 322. The second feedback resistor 322 is coupled between the input and output terminals of the second amplifier 321. The second amplifier 321 is an operational amplifier.

The variant current source 33 is coupled between the input terminal of the second TIA 32 and a power supply source or a ground terminal to output a variant current for changing the second voltage output by the second TIA 32. The second voltage can thus follow the first voltage.

As shown in FIG. 3, the second TIA 32 copies the structure of the first TIA 31. A voltage follower can be formed by adding a variant current source 33. The voltage on the second terminal B can be changed by changing the output current of the variant current source 33. The second TIA 32 and the variant current source 33 can be viewed as a voltage controller to control the second voltage output by the second TIA 32. Since the DC voltage on the first terminal A changes with the input current Iin, changing the output current of the variant current source 33 enables the voltage on the second terminal B to follow the voltage on the first terminal A for different input signals.

According to FIG. 3, the reference voltage on the second terminal B is copied from the first TIA 31. Therefore, the effects of the first terminal A and the second terminal B on the power supply source are the same. This increases the PSRR of the TIA.

Figure 4:
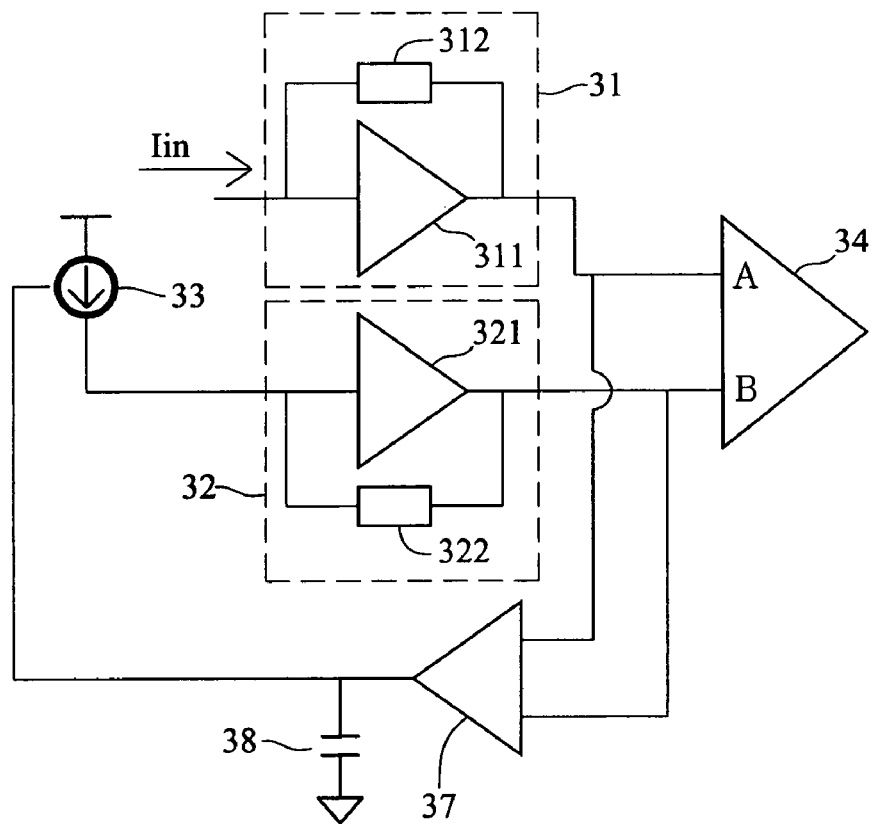
FIG. 4 is a circuit diagram according to the second embodiment of the disclosed high-frequency TIA.

FIG. 4 shows a second embodiment of the invention. Its difference from the first embodiment is in that the second embodiment has a fourth amplifier 37 and a capacitor 38. The fourth amplifier 37 is an operational amplifier to receive the first voltage output from the first TIA 31 and the second voltage output from the second TIA 32. Its output terminal is connected to the variant current source 33. The capacitor 38 is coupled between the output terminal of the fourth amplifier 37 and the ground terminal to filter out noises and unnecessary signals.

Figure 5:
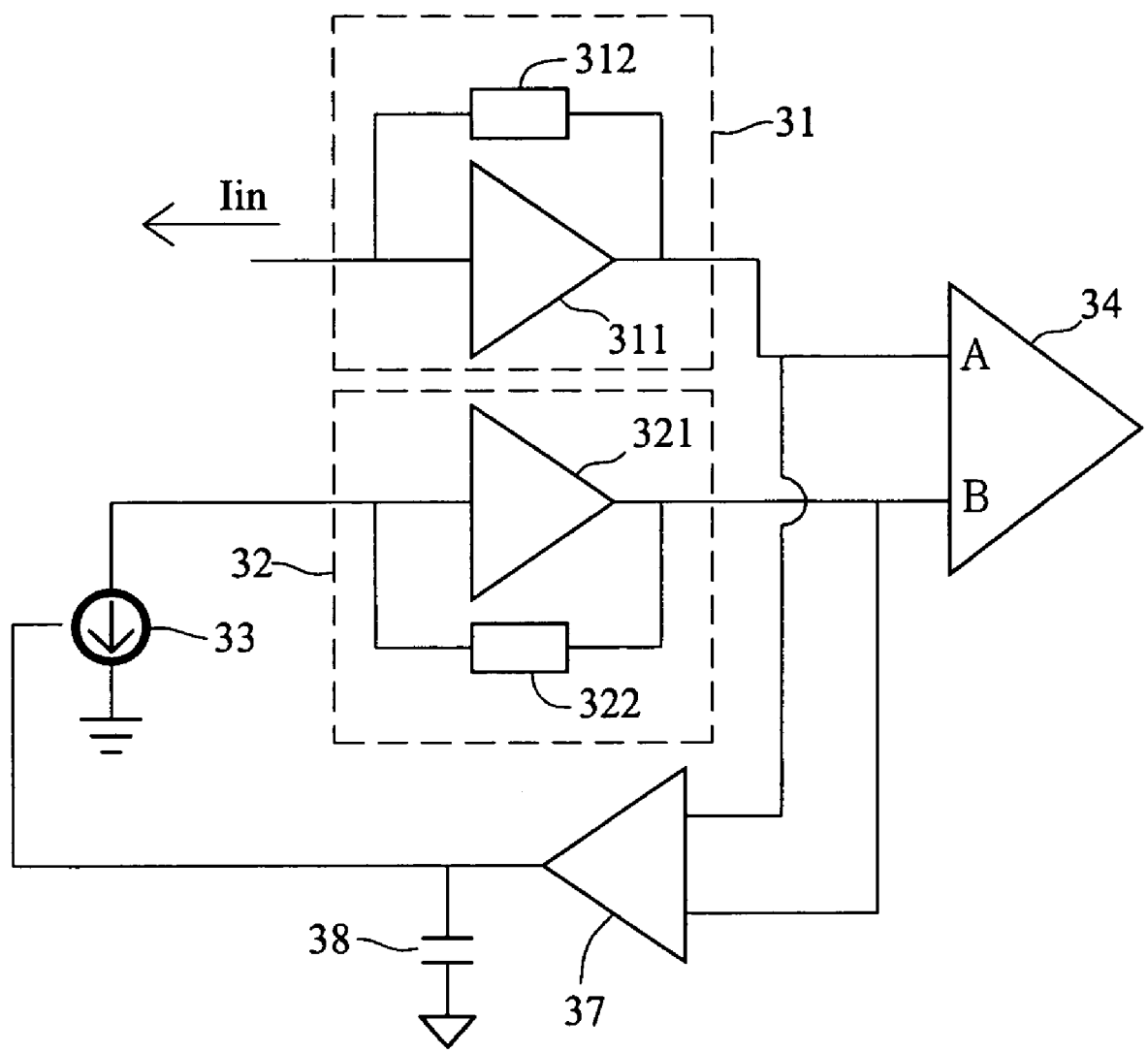
FIG. 5 is a circuit diagram according to the third embodiment of the disclosed high-frequency TIA, where the input current has a different direction from that in the second embodiment.

The third embodiment of the invention is shown in FIG. 5. Its circuit structure is the same as the second embodiment. The only difference is in the input current direction. When the input current Iin flows into the first TIA 31, the current output from the variant current source 33 also flows into the second TIA 32, as in the second embodiment. When the input current Iin flows out of the first TIA 31, the current output from the variant current source 33 also flows out of the second TIA 32, as in the third embodiment.

Figure 6:
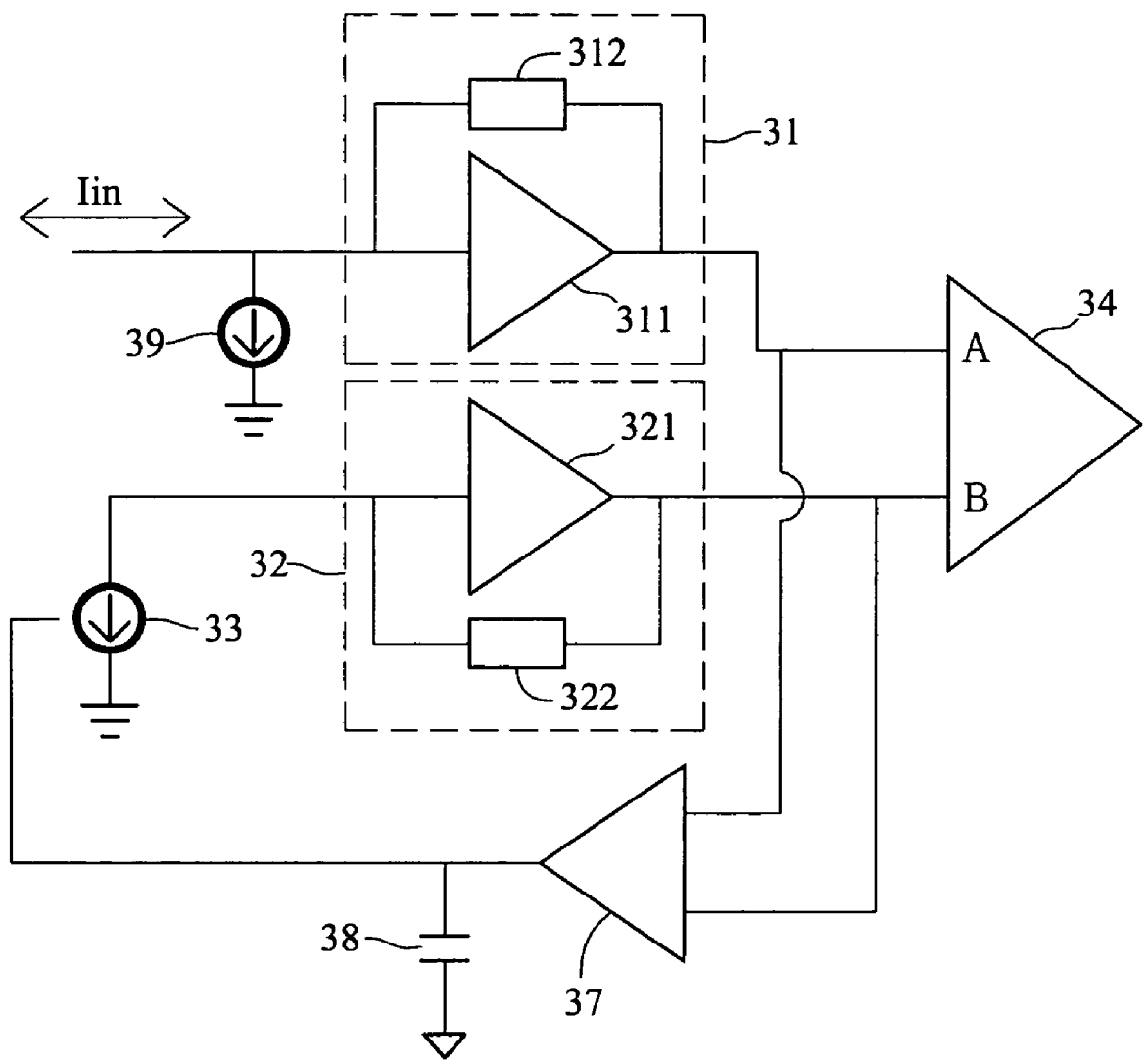
FIG. 6 is a circuit diagram according to the fourth embodiment of the disclosed high-frequency TIA.

The fourth embodiment of the invention is shown in FIG. 6. Its circuit structure is similar to those of the second and third embodiments. The difference is in that the input terminal of the first TIA 31 is coupled with a fixed current source 39. The output current flows out of the first TIA 31. No matter what direction of the input current Iin is, the variant current direction in this embodiment always flows out of the second TIA 32.

Figure 7:
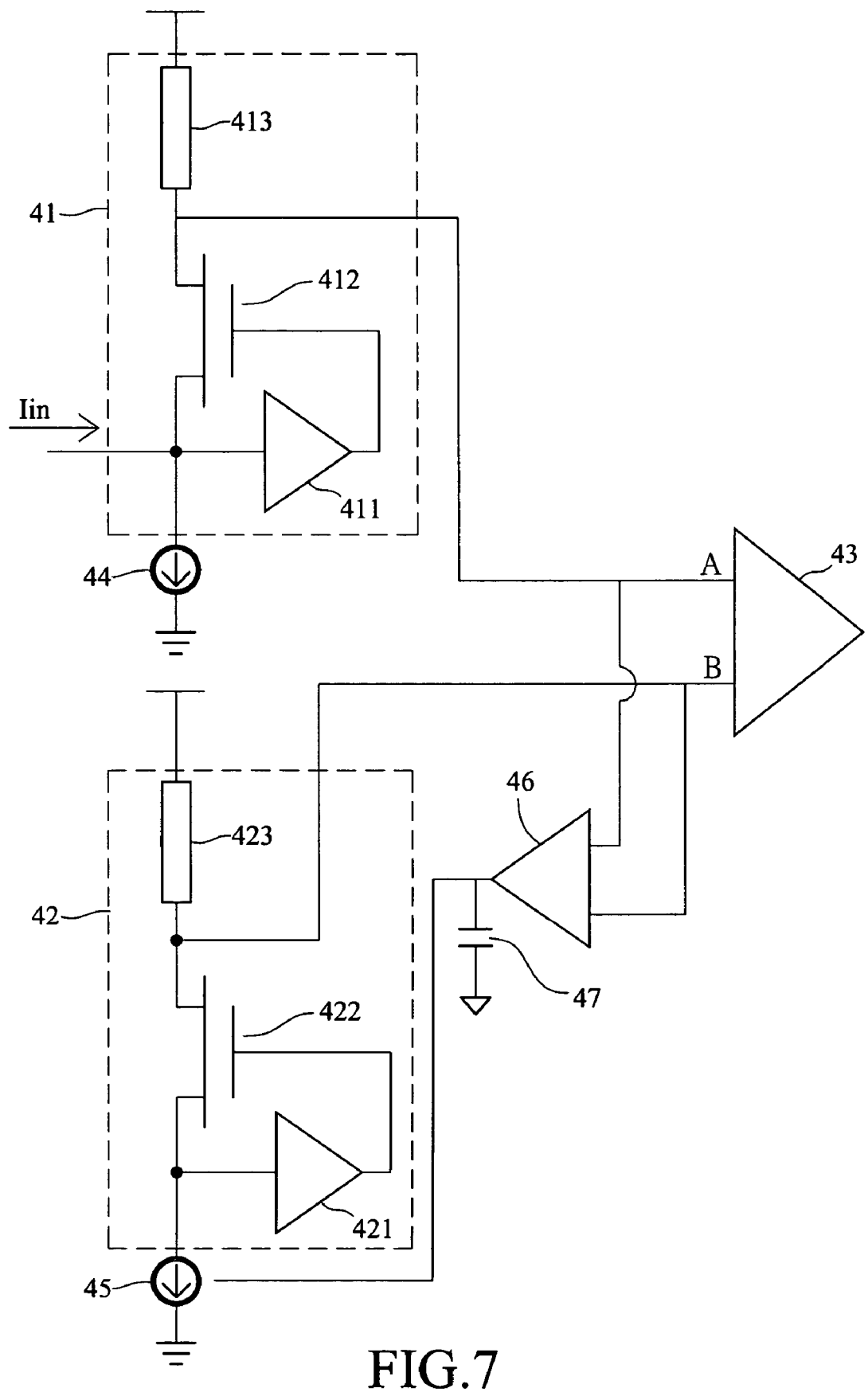
FIG. 7 is a circuit diagram according to the fifth embodiment of the disclosed high-frequency TIA.

The fifth embodiment shown in FIG. 7 uses a regulated cascode structure for the TIA. The first TIA 41 includes a first operational amplifier 411, a first transistor 412, and a first resistor 413. The first operational amplifier 411 has an input terminal and an output terminal. The first transistor 412 has a first terminal, a second terminal, and a third terminal. It can be a field effect transistor (FET) or a bipolar junction transistor (BJT). The first terminal is coupled to the output terminal of the operational amplifier 411. The second terminal is coupled to the input terminal of the operational amplifier 411. The first resistor 413 is coupled between the third terminal and a power supply source. The second TIA 42 includes a second operational amplifier 421, a second transistor 422, and a second resistor 423. The second operational amplifier 421 has an input terminal and an output terminal. The second transistor 422 has a first terminal, a second terminal, and a third terminal. It can be a FET or a BJT. The first terminal is coupled to the output terminal of the operational amplifier 421. The second terminal is coupled to the input terminal of the operational amplifier 421. The second resistor 423 is coupled between the third terminal and a power supply source.

The first TIA 41 outputs a first voltage, and the second TIA 42 outputs a second voltage. The first voltage output from the first TIA 41 and the second voltage output from the second TIA 42 enter the third amplifier 43, which is a differential amplifier.

The input terminal of the first TIA 41 is coupled to a fixed current source 44. The input terminal of the second TIA 42 is coupled to a variant current source 45. According to the fifth embodiment, the variant current direction is always out of the second TIA 42 no matter what the direction of the input current Iin is.

Moreover, the fifth embodiment also includes a fourth amplifier 46 and a capacitor 47. The fourth amplifier 46 is an operational amplifier. The capacitor 47 is coupled between the output terminal and ground terminal of the fourth amplifier 46 to filter out noises and unnecessary signals.

According to the invention, one TIA copies the other TIA. Using a variant current source, the output voltage of the copied TIA can be adjusted. This method enables one to trace the change in the output DC voltage from the first TIA. Therefore, a balanced DC voltage can be provided to the next level, avoiding problems caused by imbalanced DC voltages. In addition, the efficiency of converting the first level voltage to the current is not affected. This can increase the PSRR of the TIA.

Although the invention has been explained by the embodiments shown in the drawings described above, it should be understood to the person skilled in the art that the invention is not limited to these embodiments, but rather various changes or modifications thereof are possible without departing from the spirit and scope of the invention. Accordingly, the scope of the invention shall be determined only by the appended claims and their equivalents.

What is claimed is:

1. A high-frequency amplifier, comprising:
   a first trans-impedance amplifier (TIA), which receives an input current and outputs a first voltage;
   a second TIA, which outputs a second voltage;
   a third amplifier, which receives the first voltage and the second voltage; and
   a variant current source, which is coupled between the input terminal of the second TIA and a ground or a power supply source;
   a fourth amplifier whose input terminal receives the first and second voltages and whose output terminal is coupled to the variant current source; and
   a capacitor is coupled between the output terminal and the ground terminal of the fourth amplifier.

2. The high-frequency amplifier of claim 1, wherein the first TIA includes a first amplifier and a first feedback resistor coupled between the input terminal and the output terminal of the first amplifier.

3. The high-frequency amplifier of claim 1, wherein the second TIA includes a second amplifier and a second resistor coupled between the input terminal and the output terminal of the second amplifier.

4. The high-frequency amplifier of claim 1, wherein the variant current flows into the second TIA when the input current flows into the first TIA.

5. The high-frequency amplifier of claim 1, wherein the variant current flows out of the second TIA when the input current flows out of the first TIA.

6. A high-frequency amplifier, comprising:
   a first trans-impedance amplifier (TIA), which receives an input current and outputs a first voltage;
   a second TIA, which outputs a second voltage;
   a third amplifier, which receives the first voltage and the second voltage;
   a variant current source, which is coupled between the input terminal of the second TIA and a ground to output a variant current for changing the second voltage so that the second voltage follows the first voltage;
   a fourth amplifier, whose input terminal receives the first and second voltages and whose output terminal is coupled to the variant current source; and
   a fixed current source, which is coupled to the input terminal of the first TIA.

7. The high-frequency amplifier of claim 6, wherein the first TIA includes a first amplifier and a first feedback resistor coupled between the input terminal and the output terminal of the first amplifier.

8. The high-frequency amplifier of claim 6, wherein the first TIA includes:
   an operational amplifier, which has an input terminal and an output terminal;
   a transistor, which has a first terminal, a second terminal, and a third terminal, the first terminal coupled to the output terminal of the operational amplifier and the second terminal coupled to the input terminal of the operational amplifier; and
   a resistor, which is coupled between the third terminal and a power supply source.

9. The high-frequency amplifier of claim 8, wherein the transistor is selected from a field effect transistor (FET) and a bipolar junction transistor (BJT).

10. The high-frequency amplifier of claim 6, wherein the second TIA includes a second amplifier and a second resistor coupled between the input terminal and the output terminal of the second amplifier.

11. The high-frequency amplifier of claim 6, wherein the second TIA includes:
    an operational amplifier, which has an input terminal and an output terminal;
    a transistor, which has a first terminal, a second terminal, and a third terminal, the first terminal coupled to the output terminal of the operational amplifier and the second terminal coupled to the input terminal of the operational amplifier; and
    a resistor, which is coupled between the third terminal and a power supply source.

12. The high-frequency amplifier of claim 11, wherein the transistor is selected from a FET and a BJT.

13. The high-frequency amplifier of claim 6, wherein a capacitor is coupled between the output terminal and the ground terminal of the fourth amplifier.

14. The high-frequency amplifier of claim 6, wherein the output current of the variant current source flows out of the second TIA.

15. The high-frequency amplifier of claim 6, wherein the output current of the fixed current source flows out of the first TIA.

* * * * *